(12) United States Patent
Treffler et al.

(10) Patent No.: US 9,625,961 B2
(45) Date of Patent: Apr. 18, 2017

(54) ARRANGEMENT FOR A COMPUTER SYSTEM AND COMPUTER SYSTEM

(71) Applicant: Fujitsu Technology Solutions Intellectual Property GmbH, München (DE)

(72) Inventors: Roland Treffler, Augsburg (DE); Peter Trollmann, Augsburg (DE); Erich Pilz, Königsbrunn (DE); August Scherer, Dinkelscherben (DE)

(73) Assignee: FUJITSU LIMITED, Kawasaki (JP)

( * ) Notice: Subject to any disclaimer, the term of this patent is extended or adjusted under 35 U.S.C. 154(b) by 7 days.

(21) Appl. No.: 14/435,232

(22) PCT Filed: Oct. 14, 2013

(86) PCT No.: PCT/EP2013/071426
§ 371 (c)(1),
(2) Date: Apr. 13, 2015

(87) PCT Pub. No.: WO2014/060354
PCT Pub. Date: Apr. 24, 2014

(65) Prior Publication Data
US 2015/0268705 A1    Sep. 24, 2015

(30) Foreign Application Priority Data
Oct. 16, 2012 (DE) .................. 10 2012 109 853

(51) Int. Cl.
*G06F 1/20* (2006.01)
*G06F 1/18* (2006.01)
*H05K 7/20* (2006.01)

(52) U.S. Cl.
CPC .............. *G06F 1/20* (2013.01); *G06F 1/181* (2013.01); *H05K 7/20136* (2013.01)

(58) Field of Classification Search
USPC .................. 361/679.48, 679.49, 690–699
See application file for complete search history.

(56) References Cited

U.S. PATENT DOCUMENTS

| | | | |
|---|---|---|---|
| 5,862,037 A | 1/1999 | Behl | |
| 6,113,485 A | 9/2000 | Marquis et al. | |
| 6,130,820 A * | 10/2000 | Konstad | G06F 1/203 165/104.33 |
| 6,678,157 B1 | 1/2004 | Bestwick | |
| 8,352,650 B2 * | 1/2013 | Kurosu | G06F 1/181 361/679.4 |
| 2004/0095723 A1 | 5/2004 | Tsai et al. | |

(Continued)

FOREIGN PATENT DOCUMENTS

DE    198 61 388    8/2007

*Primary Examiner* — Tuan T Dinh
*Assistant Examiner* — Mukund G Patel
(74) *Attorney, Agent, or Firm* — Fujitsu Patent Center

(57) ABSTRACT

An arrangement for a computer system includes a heat-producing expansion card and a cooling device. The cooling device has at least one fan and a hollow body with a first opening and a second opening to cool the expansion card. The hollow body is arranged with the first opening on the expansion card. The at least one fan is arranged on the hollow body in a region of the second opening or is at least partly surrounded by the hollow body by the second opening. The at least one fan produces a flow of air through the hollow body to cool the expansion card.

12 Claims, 2 Drawing Sheets

(56) References Cited

U.S. PATENT DOCUMENTS

| | | | |
|---|---|---|---|
| 2005/0195568 A1* | 9/2005 | Shyr | G06F 1/20 361/695 |
| 2012/0007531 A1* | 1/2012 | Krishnamoorthy | F04D 27/001 318/472 |
| 2012/0008276 A1 | 1/2012 | Cheng | |

* cited by examiner

ARRANGEMENT FOR A COMPUTER SYSTEM AND COMPUTER SYSTEM

TECHNICAL FIELD

This disclosure relates to an arrangement for a computer system with a heat-producing expansion card as well as a computer system, in particular a desktop or tower system.

BACKGROUND

Heat sinks are often used to cool electronic components of a computer system, the heat sinks being brought into the best possible thermal contact with the electronic components, for example, plug-in cards. Such heat sinks are generally characterized by a large surface and dissipate heat to the surrounding air via convection.

Modern plug-in cards such as what are known as "high-end computing cards", are characterized by powerful processor units, generally graphics processors with thousands of computing units. Particularly, CPU-intensive parts of software applications are outsourced to these plug-in cards for quicker processing to relieve the load of a central processor. High-end computing cards are intended for use in 1 U or 2 U server rack systems. These server rack systems have special cooling systems which dissipate the high heat loss of the high-end computing cards resulting from high computing power. However, particularly due to the fact that such plug-in cards nowadays are only offered with passive cooling, the high-end computing cards are not suitable or are only suitable to a limited extent for use in a desktop or tower system. We found in practice that a flow of cool air of a conventional desktop or tower system is not sufficient to adequately cool high-end computing cards and, therefore, the cards are overheated. As a result, this may lead to a malfunction or a complete failure of the high-end computing cards.

SUMMARY

We provide an arrangement for a computer system including a heat-producing expansion card; a cooling device with at least one fan and a hollow body with a first opening and a second opening to cool the expansion card; wherein the hollow body is arranged with the first opening on the expansion card; the at least one fan is arranged on the hollow body in a region of the second opening or is at least partly surrounded by the hollow body by the second opening; and the at least one fan produces a flow of air through the hollow body to cool the expansion card.

We further provide a computer system including a desktop or tower system, having a housing; a card holder arranged within the housing; a mainboard arranged in the housing; a circuit board having at least one plug connection; and the arrangement with an expansion card and a cooling device; wherein the expansion card and the cooling device are arranged within the housing; the expansion card connects to the mainboard by the at least one plug connection; at least one holding element is mounted on an outer side of the hollow body; and the cooling device is held in the card holder by the at least one holding element of the hollow body.

DETAILED DESCRIPTION

Figure 1:
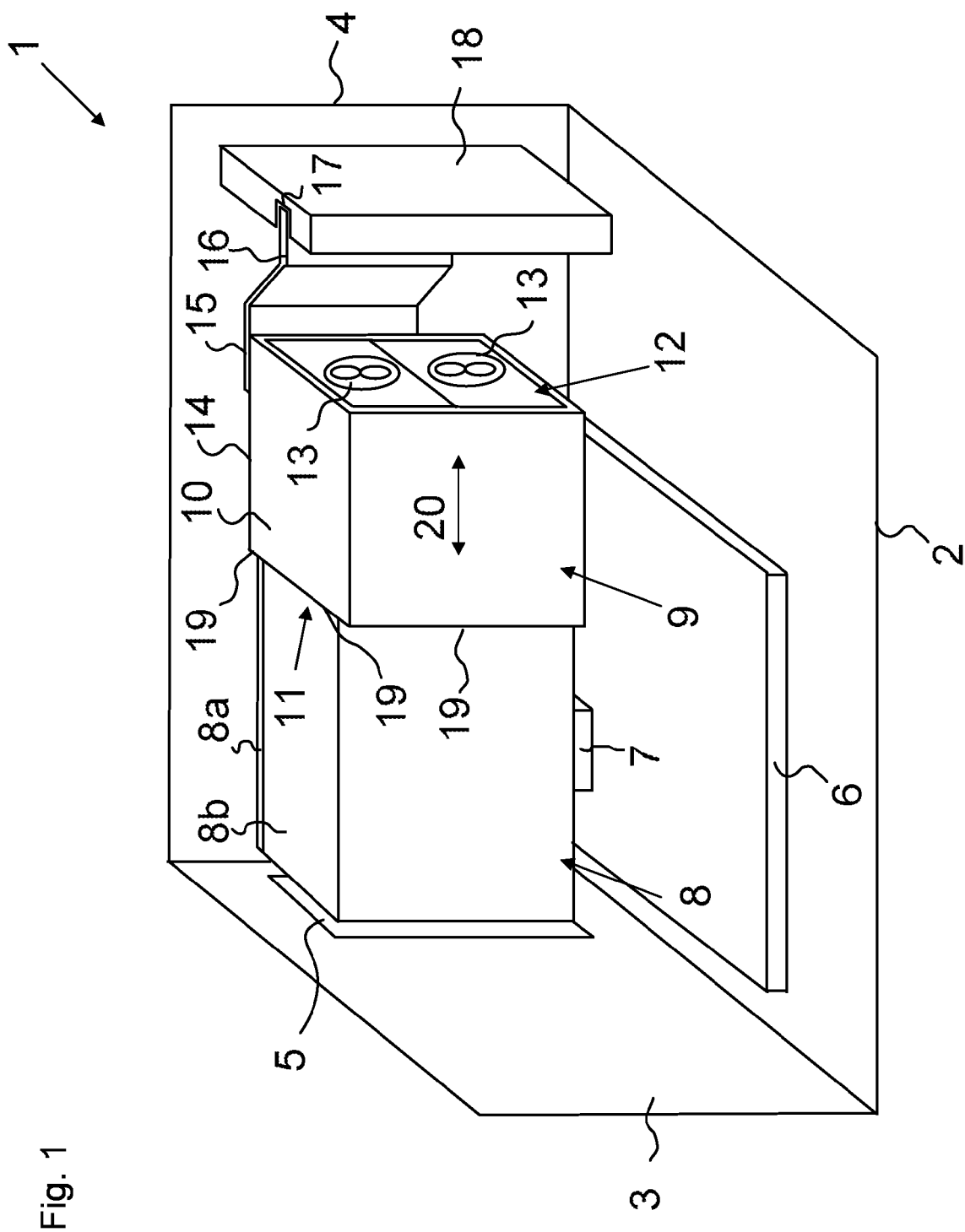
FIG. 1 shows a perspective view of a computer system in accordance with a first example.

We provide an arrangement for a computer system with a heat-producing expansion card and a cooling device. The cooling device has at least one fan and a hollow body with a first opening and a second opening to cool the expansion card. The hollow body is arranged with the first opening on the expansion card. Furthermore, the at least one fan is arranged on the hollow body in the region of the second opening or is at least partly surrounded by the hollow body by the second opening. The at least one fan is designed to produce a flow of air through the hollow body to cool the expansion card.

The heat-producing expansion card may be cooled with the aid of the additional cooling device. The hollow body of the cooling device is arranged on the expansion card in the region of the first opening. The hollow body can be fixed on the expansion card mechanically, for example, by screwing. The fan is surrounded at least partly by the hollow body in the region of the second opening of the hollow body or is arranged on the hollow body. It is thus possible for a flow of cool air produced by the fan to be directed selectively onto the expansion card, to flow directly through the expansion card, and dissipate the waste heat of the expansion card. As a result of this arrangement, it is possible, for example, to adequately cool high-end computing cards equipped only with one heat sink, even in a desktop or tower system.

The hollow body may be cuboidal, wherein the first opening is preferably opposite the second opening. A low flow resistance for the flow of air produced by the fan is thus achieved such that the cool air can be effectively fed to the expansion card.

The hollow body may surround the expansion card at least partly in the region of the first opening. It is thus possible that a flow of cool air produced by the fan can flow through and cool the expansion card in a particularly selective and direct manner.

The hollow body may have at least one third opening in the region of the expansion card surrounded by the hollow body to expose a connector of the expansion card. As a result of the provision of the third opening, it is possible, for example, to supply current to the expansion card via the exposed connector.

The hollow body may consist substantially of a plastic material. Economical production of the hollow body is thus possible.

The expansion card may have a temperature sensor to control the at least one fan. The temperature of the expansion card can be measured via the temperature sensor, whereby the at least one fan can be controlled depending on the temperature. Depending on the measured temperature value, the flow rate of the produced flow of air can be adjusted, for example.

The at least one fan may have a temperature sensor to control the at least one fan. The temperature of the waste heat of the expansion card can be measured via the temperature sensor, whereby the at least one fan can be controlled depending on the measured temperature, similarly to the above-mentioned example.

A temperature sensor that controls the at least one fan may be arranged in the region of the expansion card. The temperature of the expansion card can be measured, wherein the measured temperature values, similarly to the above-described examples, can be used to control the at least one fan.

The temperature of the expansion card can be measured independently of a flow direction of the flow of air, for example, by sucking in or blowing out air by the at least one fan.

At least one holding element to be received in a card holder may be mounted on an outer side of the hollow body. Such a card holder, which is generally used to hold long expansion cards, is located, for example, in a computer housing and holds the holding element of the hollow body. The cooling device is thus securely fixed in the computer housing.

We also provide a computer system, in particular a desktop or tower system. The computer system comprises a housing and a card holder arranged within the housing. Furthermore, the housing has a mainboard arranged in the housing, the circuit board having at least one plug connection. The computer system also has an arrangement with an expansion card and a cooling device, wherein the expansion card and the cooling device are arranged within the housing. The expansion card connects to the mainboard by the at least one plug connection. At least one holding element is mounted on an outer side of the hollow body. The cooling device is held in the card holder of the at least one holding element of the hollow body.

The computer system essentially has the above-mentioned advantages. In addition, it has proven to be advantageous that, as a result of the arrangement within the housing of the computer system, no structural modifications have to be made to the housing or a component of the computer system.

Further advantages are disclosed in the following detailed description of examples.

Our arrangements and systems will be described hereinafter on the basis of the examples with reference to the accompanying figures. In the figures, equivalent components of different examples are provided with like reference signs.

FIG. 1 shows a computer system 1, for example, a desktop or tower system in accordance with a first example, wherein for reasons of clarity only a housing underside 2, a first housing side 3 and a second housing side 4 of a housing are illustrated. The first housing side 3 has a slot panel 5 for mounting expansion cards. A mainboard 6 with plug connection 7 arranged thereon is arranged in the housing. An expansion card 8 connected by the plug connection 7 to the mainboard 6 is also arranged in the housing. The expansion card 8 is also mounted at the slot panel 5, for example, via a slot bracket (not illustrated).

The computer system 1 has a cooling device 9 with a hollow body 10. The hollow body 10 has a first opening 11 and a second opening 12 opposite the first opening 11. In the region of the first opening 11 the hollow body 10 at least partly surrounds the expansion card 8. Two fans 13 are arranged within the hollow body 10 in the region of the second opening 12. The two fans 13 are generally square in shape and therefore arranged one above the other to take into account the generally elongate form of the expansion card 8 and/or of the hollow body 10. The two fans 13, for example, can be plugged, clamped or adhesively bonded in the hollow body 10, or can be screwed to the hollow body 10. A holding element 15 is arranged on an outer side 14 of the hollow body 10, the end 16 of which holding element is held in a receiving opening 17 of a card holder 18. The card holder 18 is also arranged within the housing of the computer system 1 and can be arranged on a housing side. The card holder is generally a standard component of a computer system 1 that holds standardized expansion cards 8.

The expansion card 8, for example, may be a high-end computing card and, similarly to the plug connection 7, may have a connector according to one of the following standards: AGP, PCI, PCI express, low-profile PCI and VESA Local Bus. The expansion card 8 comprises a card 8a and a card housing 8b in which the card 8a is encapsulated. The expansion card 8, which produces a high thermal loss, is equipped only with passive cooling. This may be, for example, a lamella-like heat sink or what is known as a heat spreader, i.e. a metal plate of large surface that delivers heat by convection into the interior of the card housing 8b or the housing of the computer system 1 (not illustrated). The heat spreader is arranged, for example, within the card housing 8b on a memory or processor module arranged on the card 8a.

The expansion card 8 can be adequately cooled with the aid of the cooling device 9. To this end the fans 13 produce a flow of cool air which enters the card housing 8b in the region of the expansion card 8 surrounded by the hollow body 10. The flow of air produced by the fans 13 absorbs the heat loss produced by the expansion card 8, for example, the heat of the heat spreader. The heat absorbed by the cool air exits through the expansion card 8 via a slot bracket (not illustrated), at the slot panel 5 in accordance with the flow of air. The slot bracket for this purpose also has, for example, a plurality of openings for the air discharge. Expansion cards 8, which are originally intended for use in 1 U or 2 U server rack systems, can thus also be used in a conventional desktop or tower system.

As described, the flow of air produced by the fans 13 enters the card housing 8b of the expansion card 8 in the region of the first opening 11 and flows through the expansion card 8 in accordance with the direction of the flow of air to absorb heat. However, it is also conceivable that the hollow body 10 is dimensioned such that the produced flow of air absorbs heat in the region of the first opening 11 by flowing around the expansion card 8 and exits from one, more or all sides 19 of the hollow body 10 into the interior of the housing of the computer system. The heat can be sucked in and dissipated in the interior of the housing, for example, via system fans.

The fact that the hollow body 10 surrounds the expansion card 8 means that the hollow body 10 can ensure a length compensation for different card lengths of the expansion card 8. The hollow body 10 is dimensioned in a direction of extension according to the double-headed arrow 20 such that expansion cards 8 of different length in a direction according to the double-headed arrow 20 can be surrounded by the hollow body 10. Adequate cooling by the cooling device 9 is thus ensured for expansion cards 8 of different length since the flow of cool air of the fans 13 can enter the expansion card 8. The cooling device does not have to be structurally modified.

To control the fans 13, for example, the flow rate of the flow of air produced by the fans 13, a control circuit with a controller and a control loop can be provided. The control circuit obtains temperature values of a temperature sensor which, for example, is arranged on the expansion card 8. In a possible alternative, the control circuit may also obtain values of a temperature sensor of the mainboard 6 or of a temperature sensor arranged in the region of the expansion card 8. The temperature sensor is read out in accordance with the two last-mentioned cases via the system management bus.

By way of example the temperature sensor is a rheostat, for example, an NTC resistor and electrically connects to one of the two fans 13. The temperature sensor is arranged on the expansion card 8 or in the region of the expansion card 8 and can now be evaluated and used to control the fan 13. The evaluation can be performed here by the fan 13 itself. Alternatively, two temperature sensors or rheostats can also be provided, each of which electrically connects to a respective one of the two fans 13 and can be used to control the two fans 13. By way of example, under load, i.e. with increase of a waste heat temperature of the expansion card 8, only one fan 13 will first increase a fan speed of rotation. Should the waste heat temperatures continue to rise further, the second fan 13 can then increase the fan speed of rotation thereof accordingly. It is thus possible to cool the expansion card 8 in an essentially quiet and effective manner. In addition, the two fans 13 can be operated independently of one another such that, in the event of a defect of only one fan 13, the expansion card 8 can still be operated at increased speed of rotation and with increased noise of the further fan 13. A defect of a fan 13 can thus be signaled to the user, potentially without data loss.

Alternatively, the fans 13 can be controlled, for example, via the system board or an additional control card (not illustrated), which is arranged parallel to the expansion card 8 and is plugged into a further plug connection 7. The system board or the control card reads out a temperature sensor, for example, the temperature sensor arranged in the region of the expansion card 8, or a temperature sensor provided in the expansion card 8 via the system management bus (SM-BUS) or the I²C bus and connects to the fans 13 to control the fans.

In a further alternative, both or one of the two fans 13 may have a temperature sensor of which the measured values are fed to the control circuit.

The fans 13 connect, for example, to a power supply unit in the housing of the computer system 1 and are either directly or indirectly supplied with electrical voltage (not illustrated), from this power supply unit via controllers of the mainboard 6.

Figure 2:
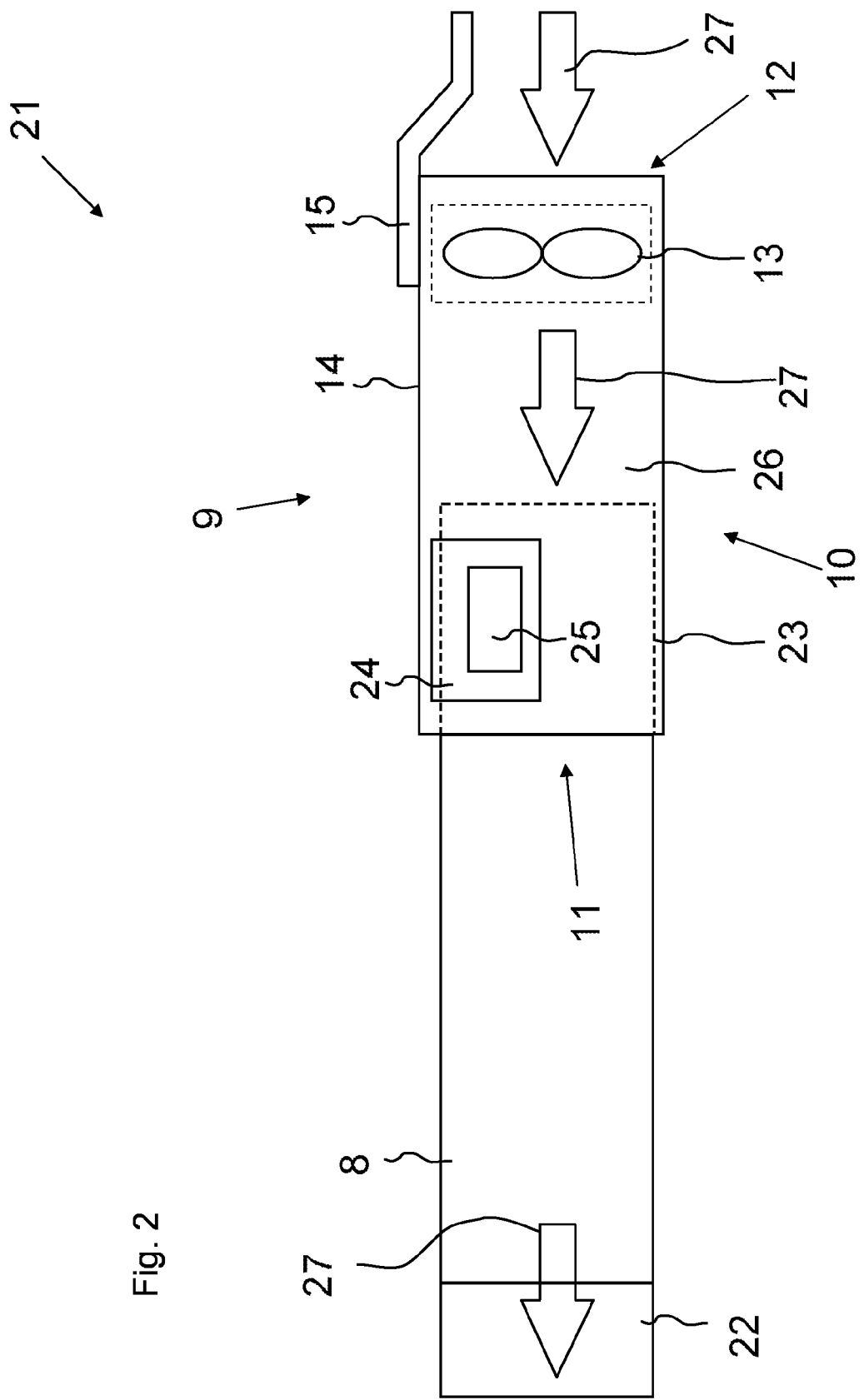
FIG. 2 shows a plan view of an arrangement in accordance with a second example.

FIG. 2 shows the plan view of an arrangement 21 with an expansion card 8 and a cooling device 9, as is to be found, for example, in a computer system 1 according to the first example on the basis of FIG. 1. The features of the expansion card 8 and the cooling device 9 already known from FIG. 1 will not be described again.

A slot bracket 22 is arranged on the expansion card 8 to mount the expansion card 8 in a slot panel. The hollow body 10 of the cooling device 9 surrounds the expansion card 8 in a region 23 (illustrated by dashed lines). The hollow body 10 has a third opening 24, which exposes a connector 25 of the expansion card 8. The expansion card 8 can connect, for example, to an additional power supply line via the connector 25. A hollow space 26 is formed within the hollow body 10 between the fan 13 and the region 23 of the expansion card 8. Depending on how far the expansion card 8 projects into the hollow body 10, the hollow space 26 can be made smaller or larger. The hollow body 10 thus compensates for different lengths of the expansion card 8, as has already been described on the basis of the example according to FIG. 1.

The fans 13 suck in cool air on the side of the second opening 12 in accordance with an arrow direction 27 and guide this into the hollow body 10. A flow of air is thus produced that infiltrates the expansion card 8 in the region 23 and flows therethrough in the arrow direction 27. Due to the flow through the expansion card 8, the flow of air absorbs the heat loss or waste heat of the expansion card 8 and removes this from the expansion card 8 in the region of the slot bracket 22. The slot bracket 22 may have openings, for example, bores or slits, for this purpose.

In an alternative example (not illustrated), the fan 13 may also produce a flow of air that runs opposite the arrow direction 27. The flow of air also absorbs heat from the expansion card 8 and dissipates this via the second opening 12 into the interior of the computer housing. In such an example it is possible, for example, that both or one of the two fans 13 have/has a temperature sensor of which measured values are fed to the above-described control circuit.

In a further alternative example (not illustrated), the expansion card 8 may have a further connector arranged in the region 23, for example, for a further additional current feed. The further connector can be accessible via the first opening 11, the second opening 12 or the third opening 24.

In an alternative example (not shown), the hollow body 10 can also be arranged on the expansion card 8, without surrounding the card. The hollow body 10 is fixed mechanically on the expansion card 8, or is flange-mounted on the expansion card 8, for example, by screwing or another connection technique. By way of example, existing bores of the expansion card 8, on which a holding element 15 could be mounted, can be used for this purpose. Alternatively, one or more other bores can be used. The hollow body 10 is thus arranged on the expansion card 8 with contact therewith.

The expansion card 8 can also be cooled adequately with the aid of such a cooling device 9. The flow of cool air produced by the fans 13 enters the card housing 8b in the region of the expansion card 8 in which the hollow body 10 is fixed on the expansion card 8. Alternatively, the fans 13 may also produce a flow of cool air by sucking in air from the expansion card 8 or from the card housing 8b. The flow of cool air produced by the fans 13 absorbs the heat loss produced by the expansion card 8 and enables efficient and selective cooling of the expansion card 8 in a desktop or tower system.

The features of a computer system or of an arrangement for a computer system presented in the described examples can be combined differently with one another to implement each of the specified advantages and/or functions.

The invention claimed is:

1. An arrangement for a computer system comprising:
a heat-producing high-end computing card:
a cooling device with at least one fan and a hollow body with a first opening and a second opening to cool the high-end computing card;
wherein the first opening is opposite to the second opening;
the hollow body is arranged with the first opening on the high-end computing card is flange mounted to the high-end computing card and extends in a longitudinal direction of the high-end computing card;
the at least one fan is arranged on the hollow body in a region of the second opening or is at least partly surrounded by the hollow body by the second opening;
a card holding element is arranged on an outer side of the hollow body for being held in a receiving opening of a card holder within a housing of the computer system; and
the at least one fan produces a flow of air through the hollow body to cool the high-end computing card.

2. The arrangement according to claim 1, wherein the hollow body is cuboidal.

3. The arrangement according to claim 1, wherein the hollow body at least partly surrounds the high end computing card with the first opening from four sides.

4. The arrangement according to claim 3, wherein the hollow body has at least one third opening in a region of the high-end computing card surrounded by the hollow body to expose a connector of the high-end computing card.

5. The arrangement according to claim 1, wherein the hollow body consists substantially of a plastic material.

6. The arrangement according to claim 1, wherein the high-end computing card has a temperature sensor that controls the at least one fan.

7. The arrangement according to claim 1, wherein the at least one fan has a temperature sensor that controls the at least one fan.

8. The arrangement according to claim 1, which has a temperature sensor arranged in the region of the high-end computing card to control the at least one fan.

9. The arrangement according to claim 1, wherein the high-end computing card comprises a card and a card housing in which the card is encapsulated.

10. The arrangement according to claim 9, wherein the flow of air enters the card housing of the high-end computing card and exits through the high-end computing card via a slot bracket of the high-end computing card.

11. A computer system comprising a desktop or tower system, having:
   a housing;
   a slot panel on a first housing side of the housing;
      a card holder with a receiving opening, the card holder being arranged within the housing opposite to the first housing side;
      a mainboard arranged in the housing; a circuit board having at least one plug connection; and
      an arrangement for the computer system, the arrangement comprising
      a heat-producing high-end computing card;
      a cooling device with at least one fan and a hollow body with a first opening and a second opening to cool the high-end computing card; wherein
      the first opening is opposite to the second opening;
      the hollow body is arranged with the first opening on the high-end computing card is flange mounted to the high-end computing and extends in a longitudinal direction of the high-end computing card;
      the at least one fan is arranged on the hollow body in a region of the second opening or is at least partly surrounded by the hollow body by the second opening;
      a card holding element is arranged on an outer side of the hollow body for being held in a receiving opening of a card holder within a housing of the computer system; and
      the at least one fan produces a flow of air through the hollow body to cool the high-end computing card, wherein:
      the high-end computing card and the cooling device are arranged within the housing;
      the high-end computing card connects to the mainboard by the at least one plug connection;
      the high-end computing card is mounted at the slot panel via a slot bracket;
      at least one holding element is mounted on an outer side of the hollow body; and
      the at least one holding element is held in a receiving opening of the card holder by the at least one holding element of the hollow body.

12. The computer system according to claim 11, wherein the mainboard has at least one temperature sensor that controls the at least one fan.

* * * * *